United States Patent
Akel et al.

(10) Patent No.: US 10,922,020 B2
(45) Date of Patent: Feb. 16, 2021

(54) WRITING AND QUERYING OPERATIONS IN CONTENT ADDRESSABLE MEMORY SYSTEMS WITH CONTENT ADDRESSABLE MEMORY BUFFERS

(71) Applicant: Micron Technology, Inc., Boise, ID (US)

(72) Inventors: Ameen D. Akel, Rancho Cordova, CA (US); Sean S. Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 16/382,511

(22) Filed: Apr. 12, 2019

(65) Prior Publication Data
US 2020/0326880 A1 Oct. 15, 2020

(51) Int. Cl.
*G06F 3/06* (2006.01)
*G11C 15/04* (2006.01)
*G11C 13/00* (2006.01)

(52) U.S. Cl.
CPC .......... *G06F 3/0659* (2013.01); *G06F 3/0604* (2013.01); *G06F 3/0673* (2013.01); *G11C 13/0069* (2013.01); *G11C 15/046* (2013.01); *G11C 13/0004* (2013.01)

(58) Field of Classification Search
CPC .... G06F 3/0659; G06F 3/0604; G06F 3/0673; G11C 13/0069; G11C 15/046; G11C 13/0004
See application file for complete search history.

(56) References Cited

U.S. PATENT DOCUMENTS

| | | | |
|---|---|---|---|
| 5,596,686 | A | 1/1997 | Duluk |
| 6,263,404 | B1 | 7/2001 | Borkenhagen et al. |
| 6,317,349 | B1* | 11/2001 | Wong ................... G11C 15/046 365/185.05 |
| 7,675,765 | B2 | 3/2010 | Derhacobian et al. |
| 2003/0142525 | A1 | 7/2003 | Batson et al. |
| 2007/0244893 | A1 | 10/2007 | Abdat |
| 2010/0250843 | A1 | 9/2010 | Eilert |
| 2013/0054886 | A1 | 2/2013 | Eshraghian et al. |
| 2013/0242677 | A1* | 9/2013 | Iyer ....................... G11C 11/419 365/189.15 |

(Continued)

OTHER PUBLICATIONS

U.S. Appl. No. 15/827,019, entitled "Comparing Input Data to Stored Data," filed Nov. 30, 2017, 77 pages.

(Continued)

*Primary Examiner* — Eric Cardwell
(74) *Attorney, Agent, or Firm* — Brooks, Cameron & Huebsch, PLLC

(57) ABSTRACT

An apparatus (e.g., a content addressable memory system) can have a controller, a first content addressable memory coupled to the controller, and a second content addressable memory coupled to the controller. The controller can be configured to cause the first content addressable memory to write data in the first content addressable memory, cause the second content addressable memory to write the data in the second content addressable memory, and cause the second content addressable memory to query the data written in the second content addressable memory while the first content addressable memory continues to write the data in the first content addressable memory.

30 Claims, 9 Drawing Sheets

(56) References Cited

U.S. PATENT DOCUMENTS

2015/0006808 A1   1/2015  Miller et al.
2015/0213153 A1   7/2015  Shah et al.
2015/0339222 A1  11/2015  Makino

OTHER PUBLICATIONS

U.S. Appl. No. 15/827,119, entitled "Operations on Memory Cells," filed Nov. 30, 2017, 76 pages.
International Search Report and Written Opinion from related International Application No. PCT/US2020/026108, dated Jul. 17, 2020, 12 pages.

* cited by examiner

WRITING AND QUERYING OPERATIONS IN CONTENT ADDRESSABLE MEMORY SYSTEMS WITH CONTENT ADDRESSABLE MEMORY BUFFERS

TECHNICAL FIELD

The present disclosure relates generally to content addressable memories, and, more particularly, to writing and querying operations in content addressable memory systems with content addressable memory buffers.

BACKGROUND

Memory systems may be implemented in electronic systems, such as computers, cell phones, hand-held electronic devices, etc. Some memory systems, such as solid-state drives (SSDs), embedded Multi-Media Controller (eMMC) devices, Universal Flash Storage (UFS) devices, and the like, may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three-dimensional cross-point memory (e.g., 3D XPoint), resistive random access memory (RRAM), ferroelectric random access memory (FeRAM), magnetoresistive random access memory (MRAM), and programmable conductive memory, among other types of memory.

Some memory cells, such as various resistance variable memory cells, can be arranged in cross-point architectures such that the memory cells are located at intersections of signal lines used to access the cells (e.g., at intersections of word lines and bit lines). The state (e.g., stored data value) of a resistance variable memory cell can depend on the programmed resistance of the memory cell, for example.

Memories typically return user data to the host (e.g., during a read operation) in response to an address supplied by the host. Another form of memory is content addressable memory (CAM), also known as associative pattern memory (APM). In some examples, CAMs can be queried to determine whether input data (e.g., an input data vector) is stored in the CAM. For example, a CAM may receive the input data and may perform a search to determine whether stored data (e.g., stored data vectors) in the CAM match the input data.

CAM can be utilized as a hardware-based search device in applications that require fast searches or pattern matching, such as in computer systems, databases, image or voice recognition, biometrics, data compression, cache memory controllers, or computer and communication networks (e.g., in network switches, media access controllers, network routers, etc.).

DETAILED DESCRIPTION

In various instances, a non-volatile memory can be used as a CAM. Providing non-volatile memory CAMs can have various benefits over volatile CAMs (e.g., SRAM CAMs). For instance, a non-volatile CAM does not require power to maintain its data, and non-volatile memory cells often have a smaller footprint as compared to volatile memory cells and so can provide a greater storage density. Often times volatile CAMs can provide faster data write times as compared to non-volatile CAMs so that data written to a volatile CAM can be available for querying sooner than the data written in a non-volatile CAM.

In some examples, a non-volatile CAM can be inaccessible for querying while data is being written to the CAM. For example, previously stored data in the non-volatile CAM can be inaccessible for querying while additional data are being written in the non-volatile CAM. This problem can be exacerbated by the relatively long write times associated with non-volatile CAMs because the previously written data can be inaccessible to query during the write time.

As described further herein, various embodiments of the present disclosure provide CAM implementations that can account for the write times associated with non-volatile memory cells. Accordingly, embodiments can provide non-volatile CAMs having improved query times as compared to previous approaches, among other benefits.

As an example, a number of embodiments can employ a non-volatile first CAM as a main CAM and second CAM as a buffer CAM, such as a volatile CAM (e.g., an SRAM buffer CAM). Data can be written in the main CAM and the buffer CAM, and the data written in the buffer CAM can be queried while continuing to write the data in the main CAM. This can eliminate, for example, the delays associated with waiting until the data is written in main CAM to query the data in main CAM.

In some examples, previously written data in the main CAM can be copied into the buffer CAM so that the previously written data can be queried in buffer CAM while writing additional data in the main CAM. This, for example, can eliminate the problem of the previously written data in the main CAM being inaccessible to query while writing the additional data in the main CAM.

Using a buffer CAM in conjunction with the main non-volatile CAM can reduce the energy requirements, costs, and the time it takes to obtain reliable comparison results compared to using a DRAM buffer or a table as a buffer in conjunction with the main CAM. For example, using a DRAM or a table can involve the time-consuming process of scanning the entire content of the DRAM or the table to identify the data corresponding to the data in the main CAM being compared to the input data.

Figure 1A:
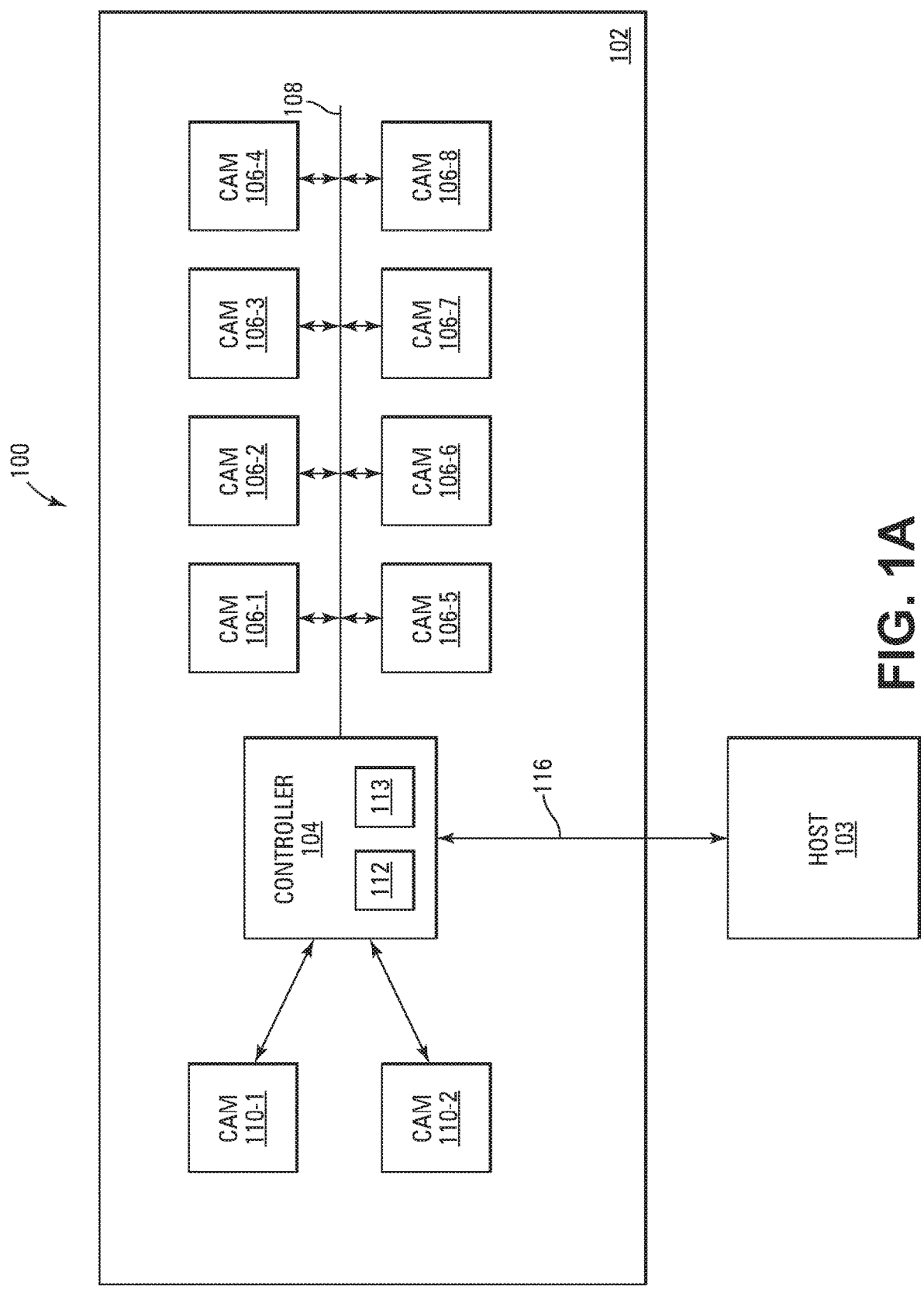
FIG. 1A is a simplified block diagram of an apparatus in accordance with a number of embodiments of the present disclosure.

FIG. 1A is a simplified block diagram of an apparatus in the form of a computing system 100 in accordance with a number of embodiments of the present disclosure. Computing system 100 includes an apparatus in the form of CAM system 102 that can be, for example, a peripheral component interconnect express (PCIe) CAM system, among other types of CAM systems.

CAM system 102 can include a controller 104, CAMs 106-1 to 106-8 coupled to controller 104 over a bus 108, and CAMs 110-1 and 110-2 coupled to controller 104. Although eight CAMs 106 and two CAMs 110 are shown, there can be any number of CAMs 106 and CAMs 110. In some examples, CAMs 106 can be referred to as main (e.g., primary) CAMs, and CAMs 110 can be referred to as buffer CAMs (e.g., because CAMs 110 can act as buffers for CAMs 106). In some examples, there can be a single main CAM 106 that can include CAMs 106-1 to 106-8, and there can be a single buffer CAM 110 that can include CAMs 110-1 and 110-2. Herein, "CAM 106" and/or "main CAM" will be used to refer to one or more of CAMs 106-1 to 106-8, and "CAM 110" and/or "buffer CAM" will be used to refer to one or more of CAMs 110-1 and 110-2.

Controller 104 can cause the main CAM to write data, such as one or more data vectors, in the main CAM, cause the buffer CAM to write the data in the buffer CAM, and cause the buffer CAM to query the data written in the buffer CAM while the main CAM continues to write the data in the main CAM. In some examples, querying data in the main CAM and/or the buffer CAM can include comparing input data (e.g., an input data vector) to the data in the main CAM and/or the buffer CAM. In some examples, controller 104 can cause the buffer CAM to remove the data written in the buffer CAM in response to determining that the main CAM has finished writing the data in the main CAM and can subsequently cause the main CAM to query the data in the main CAM.

In various examples, controller 104 can include match validation circuitry that can be used to validate a match between the input data vector and a data vector stored in the buffer CAM or the main CAM. For example, in response to receiving an indication that the input data vector matches a stored data vector, the match validation circuitry can cause the buffer CAM or the main CAM to read the stored data vector and return the data vector read from the buffer CAM or the main CAM to controller 104. The match validation circuitry can then compare the returned the data vector to the input data vector to determine whether the previously indicated match is valid.

In some examples, the main CAM and the buffer CAM can include match validation circuitry that can be used to validate a match between the input data vector and a stored vector. For example, in response the input data vector matching the stored data vector, the match validation circuitry can read the stored data vector and compare the read data vector to the input data vector to determine whether the previously indicated match is valid. If the match is invalid, the match validation circuitry can change the result of the comparison from a match to a mismatch and send the result to controller 104.

Controller 104 can cause the main and buffer CAMs to write the data in the main CAM and in the buffer CAM concurrently until the buffer CAM is finished writing the data in the buffer CAM and can cause the buffer CAM to query the data written in the buffer CAM while the main CAM continues to write the data in the main CAM. For example, the main CAM can write the data in the main CAM for a first period of time; the buffer CAM can write the data in the buffer CAM for a second period of time that overlaps an initial portion of the first period of time, and the buffer CAM can query the data written in the buffer CAM during a remaining portion of the first period of time. In some examples, the buffer CAM can write the data in the buffer CAM faster than the main CAM can write the data in the main CAM.

In some examples, the main CAM can be a non-volatile CAM and the buffer CAM can be a volatile CAM, such as an SRAM CAM. For example, the data written and/or stored in the buffer CAM can be written and/or stored in SRAM memory cells, and the data written and/or stored in the main CAM can be written and/or stored in non-volatile memory cells. In some examples, the main CAM can be a cross-point device, such as a 3D XPoint device, that can include resistance variable memory cells. However, the disclosure is not so limited, and the main CAM can include other types of non-volatile memory cells, Controller 104 can create a data structure, such as a lookup (e.g., mapping) table 112 (e.g., in controller 104) each time a data vector is written in the main CAM (e.g., in response to the main CAM writing the data vector in the main CAM). Note that the buffer CAM can write a corresponding data vector in the buffer CAM each time the main CAM writes a data vector in the main CAM. In some examples, controller 104 can manage lookup table 112.

In some examples, controller 104 can include a logical-to-physical (L2P) mapping table 113 that can map a logical address, received from host 103, of a data vector to a physical address of the data vector in the main CAM.

Controller 104 can be a field programmable gate array (FPGA) and/or an application specific integrated circuit (ASIC), among other types of controllers. Host 103 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 103 can include one or more processors capable of accessing CAM system 102 (e.g., via controller 104) over an interface 116 that can include a bus. Interface 116 can be a standardized interface, such as a serial advanced technology attachment (SATA), PCIe, or a universal serial bus (USB), among various others.

In some examples, CAM system 102 can be part of a memory system of computing system 100. For example, the memory system can be a storage system, such as an SSD, a UFS device, an eMMC device, or the like. In various examples in which CAM system 102 can be part of the memory system, controller 104 can be a portion of (e.g., control logic integrated in) a memory system controller (e.g., an SSD controller, an application specific integrated circuit ASIC, a processor, or the like) coupled the memory system and configured to control various memory devices of the memory system.

Figure 1B:
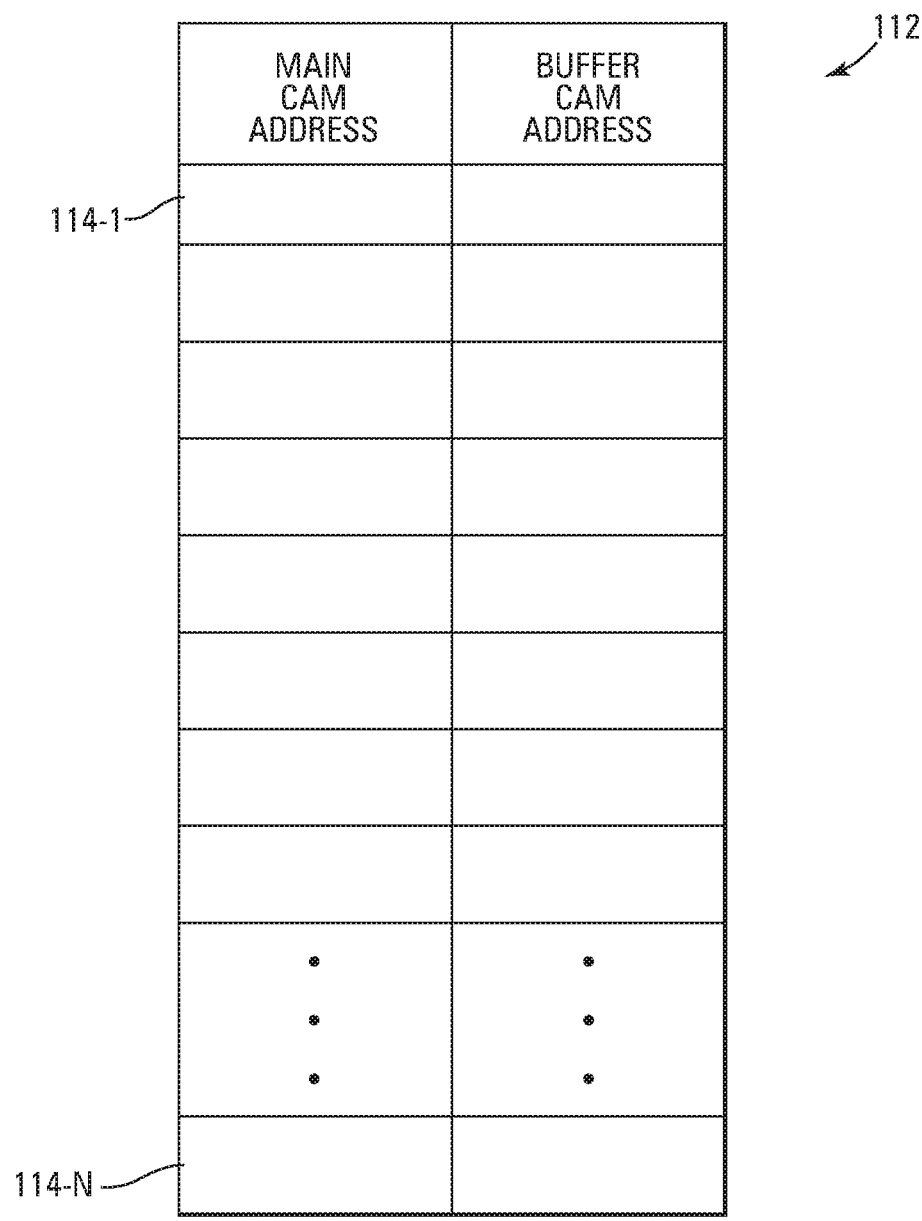
FIG. 1B illustrates an example of a data structure in accordance with a number of embodiments of the present disclosure.

FIG. 1B illustrates an example of a data structure in the form of lookup table 112 in accordance with a number of embodiments of the present disclosure. Lookup table 112 can include entries 114-1 to 114-N that can map locations (e.g., addresses of locations) in the main CAM to locations (e.g., addresses of locations) in the buffer CAM. For example, lookup table 112 can map main CAM addresses to buffer CAM addresses.

In some examples, the main CAM addresses can be the physical addresses of locations of groups memory cells in the main CAM in which the data vectors are being written, and the buffer addresses can be the physical addresses of locations of groups of memory cells in the buffer CAM storing the data vectors corresponding to the data vectors being written in the main CAM. For example, entries 114-1 to 114-N can map addresses of locations of data vectors in the main CAM that are being written in the main CAM to addresses of locations of corresponding data vectors in the buffer CAM. Controller 104 can manage lookup table 112, for example, by writing in an entry 114, the address of the data vector in the main CAM and the address of the data vector in the buffer CAM. The mapping in an entry 114 can be valid while the main CAM is writing the corresponding data vector in the location in the main CAM, and controller 104 can manage lookup table 112, for example, by invalidating the mapping in response to determining that the main CAM has finished writing the data in the location in the main CAM.

In some examples, the main CAM addresses can be the physical addresses of memory tiles in the main CAM, and the buffer addresses can be the physical addresses of regions in the buffer CAM. For example, entries 114-1 to 114-N can map addresses of locations of memory tiles in the main CAM to addresses of the locations of regions in the buffer CAM. In some examples, each of the memory tile addresses can be mapped a range of addresses corresponding to a region in the buffer CAM. In some examples, the mapping in an entry 114 can be valid as long as the corresponding memory tile is partially filled (e.g., is not completely filled) with data, and controller 104 can invalidate the mapping in response to determining that the corresponding memory tile is completely filled.

Figure 2A:
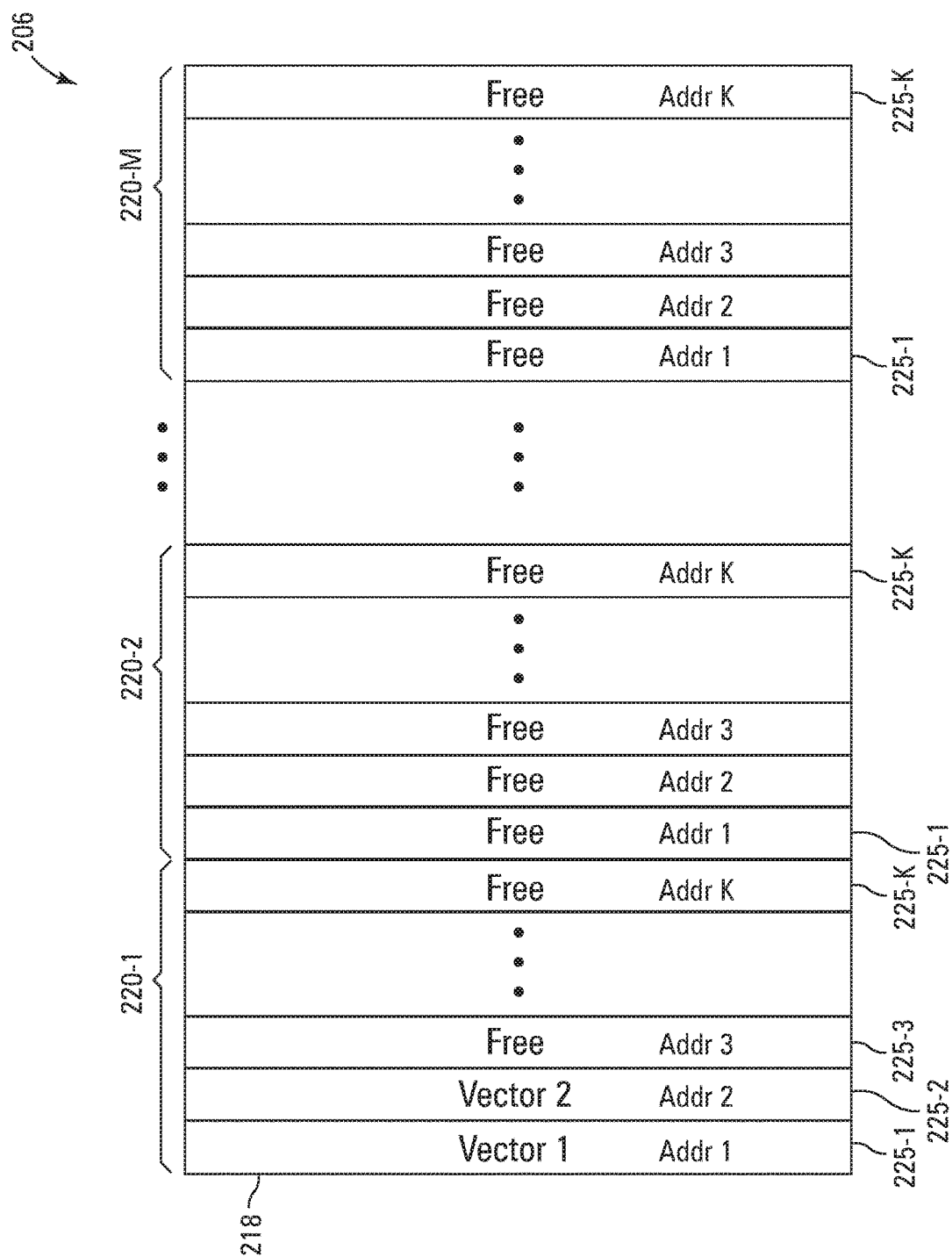
FIG. 2A is a block diagram of a portion of a non-volatile CAM corresponding to a particular stage of writing in accordance with a number of embodiments of the present disclosure.
Figure 2B:
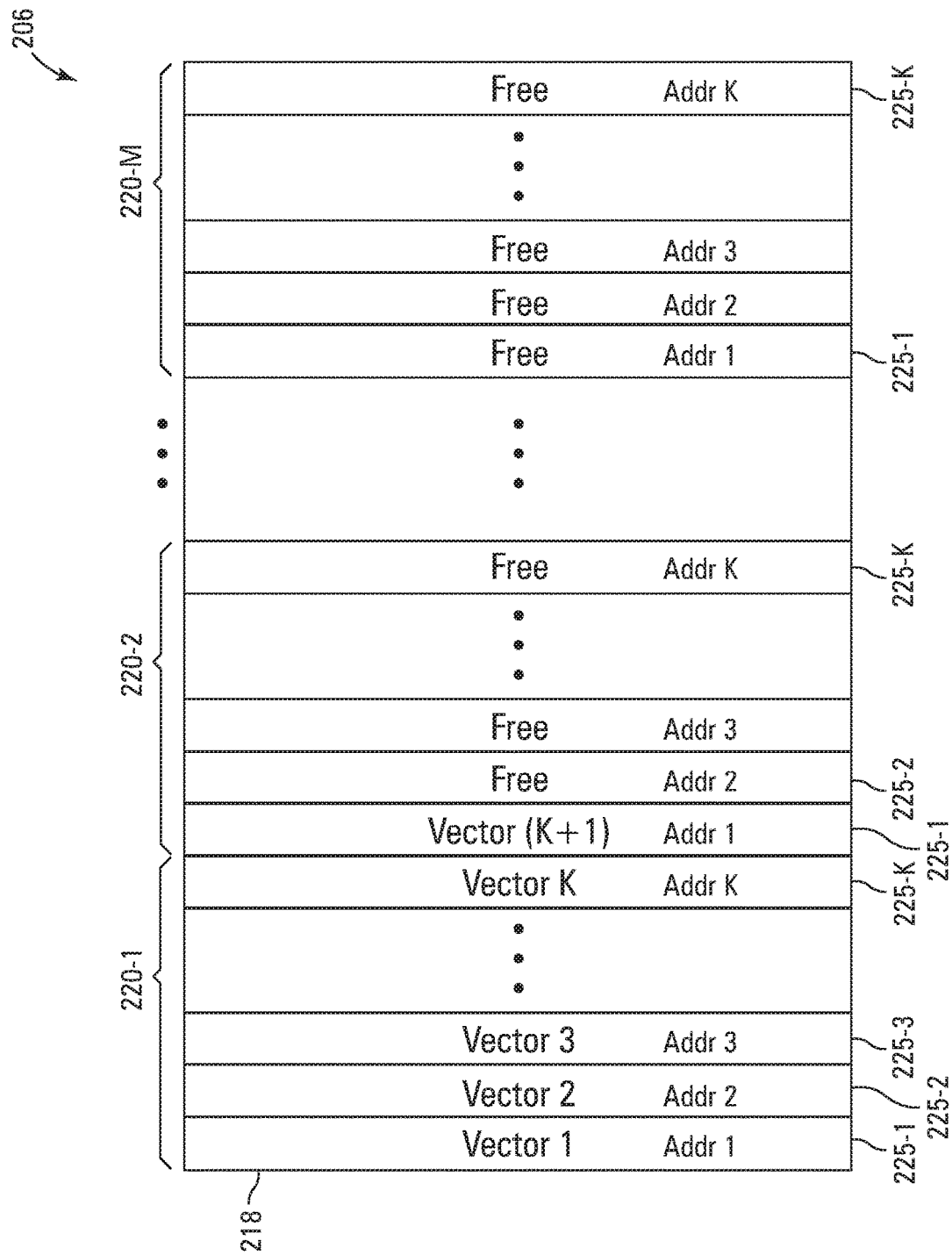
FIG. 2B is a block diagram of a portion of a non-volatile CAM corresponding to a particular stage of writing subsequent to the particular stage of writing in FIG. 2A in accordance with a number of embodiments of the present disclosure.

FIG. 2A is a block diagram of a portion of a non-volatile CAM corresponding to a particular stage of writing in accordance with a number of embodiments of the present disclosure. FIG. 2B is a block diagram of a portion of a non-volatile CAM corresponding to a particular stage of writing subsequent to the particular stage of writing in FIG. 2A in accordance with a number of embodiments of the present disclosure. For example, FIGS. 2A and 2B illustrate a non-volatile CAM array 218 of a main CAM, such as a CAM 206 that can be a CAM 106. CAM array 218 can include a number of memory tiles 220 (e.g., memory tiles 220-1 to 220-M). In some examples, a memory tile can be the smallest grouping of memory cells unavailable to query during a write operation. For example, a memory tile 220 might be unavailable to query while a data vector is being written to that memory tile.

Each of the memory tiles 220-1 to 220-M can include respective groups of memory cells in the respective locations 225-1 to 225-K. The respective locations 225-1 to 225-K in each of the memory tiles 220-1 to 220-M can respectively have the physical addresses Addr 1 to Addr K. Respective data vectors can be written in the respective locations 225-1 to 225-K in each of the memory tiles 220-1 to 220-M. In some examples, L2P table 113 can map a respective logical address from host 103 to a respective address Addr in a respective memory tile 220 in a respective main CAM.

Each respective location 225 can be specified by specifying the location of the respective main CAM in a CAM system, such as a CAM 106 in CAM system 102, the location of the respective memory tile, such as a memory tile 220, in the respective main CAM, and the respective location 225 in the respective memory tile. For example, location 225-2 in memory tile 220-1 in CAM 106-3 can be specified by specifying the location of CAM-106-3 in CAM system 102, the location of memory tile 220-1 in CAM-106-3, and the location 225-2 in memory tile 220-1.

A respective physical address Addr can specify the location of a respective data vector, for example, by specifying the location of a respective main CAM in the CAM system, the location of a respective memory tile in the respective main CAM, and the location of the respective data vector in the respective memory tile. For example, the physical address Addr 2 can specify the location of data vector Vector 2 by specifying the location of CAM 106-3, the location of memory tile 220-1 in CAM 106-3, and the location 225-1 of Vector 2 in memory tile 220-1.

In some examples, the locations 225-1 to 225-K in each memory tile 220 can be an ordered sequence, in which the locations 225-1 to 225-K are respectively the first to the Kth locations in the ordered sequence. Moreover, the addresses Addr 1 to Addr K can be an ordered sequence, in which the addresses Addr 1 to Addr K are respectively the lowest to the highest addresses in the ordered sequence. For example, the data vectors can be written sequentially (e.g., one after another) to a sequence of free locations 225-1 to 225-K in the order the data vectors are received from host 103.

Respective data vectors can be written in sequence in a sequence of respective first available free locations. For example, Vector 1 and Vector 2 may be received in order from host 103, and the sequence of locations 225-1 to 225-K may be available free locations in memory tile 220-1. As such, Vector 1 may be written to the first available free location 225-1 and Vector 2 may be subsequently written to the first available free location 225-2 after location 225-1. Note that the next K−2 data vectors Vector 3 to Vector K successively received from host 103 can be respectively written sequentially to locations 225-3 to 225-K, the next available free locations after location 225-2, as shown in FIG. 2B.

In some examples, memory tiles 220-1 to 220-M can be an ordered sequence, in which memory tiles 220-1 to 220-M are respectively the first to the Mth memory tiles in the ordered sequence. Memory tiles 220-1 to 220-M can, for example, be written sequentially.

Vector (K+1) can be received after Vector K is written in location 225-K, and thus after tile 220-1 is full. For example, Vector (K+1) can be written in the first available free memory tile 220-2 in the sequence of memory tiles, for example, in the first available free location 225-1 in the sequence of locations 225-1 to 225-K in memory tile 220-2, as shown in FIG. 2B.

In some examples, the K+1 data vectors Vector 1 to Vector (K+1) can be respectively written in response to K+1 write commands sequentially received at controller 104 from host 103. For example, the write commands can respectively specify logical addresses, and the L2P mapping table 113 may respectively map the first K logical addresses to the physical addresses Addr 1 to Addr K in tile 220-1 and the K+1 logical address to address Addr 1 in tile 220-2.

In some examples, controller 104 can cause CAM 206 to write enable the first available memory tile 220 in the sequence memory tiles 220-1 to 220-M in response to receiving a write command, such as the first write command of the aforementioned K+1 write commands from host 103. For example, the first available memory tile can be the first memory tile in the sequence having at least one free location.

Controller 104 may then cause all of data vectors previously written in the write enabled memory tile to be copied to a corresponding region of the buffer CAM. For example, controller can cause CAM 206 to read all of data vectors previously written in the write enabled memory tile and output the read data vectors to controller 104. Controller 104 can then send the data vectors read from CAM 206 to the buffer CAM and cause the buffer CAM to write the data vectors in the corresponding region of the buffer CAM.

Controller 104 may cause CAM 206 to subsequently write the data vector specified in the command in the first available free location in the write enabled memory tile and the buffer CAM to write the data vector specified in the command the region in the buffer CAM so that CAM 206 and the buffer CAM write the data vector concurrently until the buffer CAM finishes writing the data vector in the region in the buffer CAM. Controller 104 can map an address of the location of tile to an address of the region and query the region in place of the tile while CAM 206 continues to write the data vector in the write enabled memory tile. Controller 104 might invalidate the mapping of the address of the location of tile to the address of the region and/or remove the data vectors from the region in response to finishing writing the data vector in the write enabled memory tile.

In an example, Vector 1 and Vector 2 might have been previously written in tile 220-1, as shown in FIG. 2A. Subsequently, controller 104 might receive write commands to write Vector 3 to Vector K. Controller 104 may cause Vector 1 and Vector 2 to be copied to the region in the buffer CAM and cause CAM 206 and the buffer CAM to write Vector 3 to Vector K in tile 220-1 and in the region in the buffer CAM concurrently until the buffer CAM finishes writing Vector 3 to Vector K in the region in the buffer CAM.

Controller 104 can map an address of the location of tile 220-1 to an address of the region and query the region in place of tile 220-1 while CAM 206 continues to write Vector 3 to Vector K in the memory tile 220-1. Controller 104 might invalidate the mapping of the address of the location of tile 220-1 to the address of the region and/or remove the data vectors from the region in response to CAM 206 finishing writing Vector 3 to Vector K in tile 220-1.

Alternatively, controller 104 might invalidate the mapping of the address of the location of tile 220-1 to the address of the region and/or remove the data vectors from the region in response to determining that memory tile 220-1 is completely filled with data vectors, as shown in FIG. 2B. For example, controller 104 can keep track of how full tile 220-1 is (e.g., by keeping track of the percentage of tile 220-1 used). Controller 104 can cause the buffer CAM to query the region in the buffer CAM in place of CAM 206 querying tile 220-1 as long as tile 220-1 is partially filled with data vectors, regardless of whether tile 220-1 is write enabled and/or is being actively written to. For example, controller 104 can cause the buffer CAM to maintain a copy of the data vectors in the region of the buffer CAM until tile 220-1 is completely filled.

Note that after the mapping of the address of the location of tile 220-1 to the address of the region in the buffer CAM is invalidated and/or Vector 1 to Vector K are removed from the region in the buffer CAM, controller can cause CAM 206 to write Vector (K+1) to location 225-1 in memory tile 220-2 and to a region in the buffer CAM concurrently until Vector (K+1) is written in the buffer CAM. Controller 104 can map memory tile 220-2 to the region in the buffer CAM. Controller 104 can cause the buffer CAM to query Vector (K+1) in the buffer CAM while CAM 206 continues to write Vector (K+1) in memory tile 220-2 and/or until memory tile 220-2 is completely filled with data vectors. Moreover, CAM 206 can query completely filled tile 220-1 and buffer CAM can query the region in the buffer CAM corresponding to memory tile 220-2 concurrently.

In some examples, host 103 can send a write command to write a new data vector in a location in a memory tile that stores a previously written data vector, for example, to update (e.g., rewrite) the previously written data vector. For example, the write command might include a logical address that is mapped, by L2P table 113, to location 225-1 that stores Vector 1. In response to the write command, controller 104 may write the new data vector in the first available free location. For example, the first available free location can be location 225-3 in memory tile 220-1 in FIG. 2A or location 225-2 in memory tile 220-2 in FIG. 2B. Controller 104 may then modify L2P table 113 to remap the logical address to location 225-3 in tile 220-1 in FIG. 2A or location 225-2 in tile 220-2 in FIG. 2B.

Figure 3A:
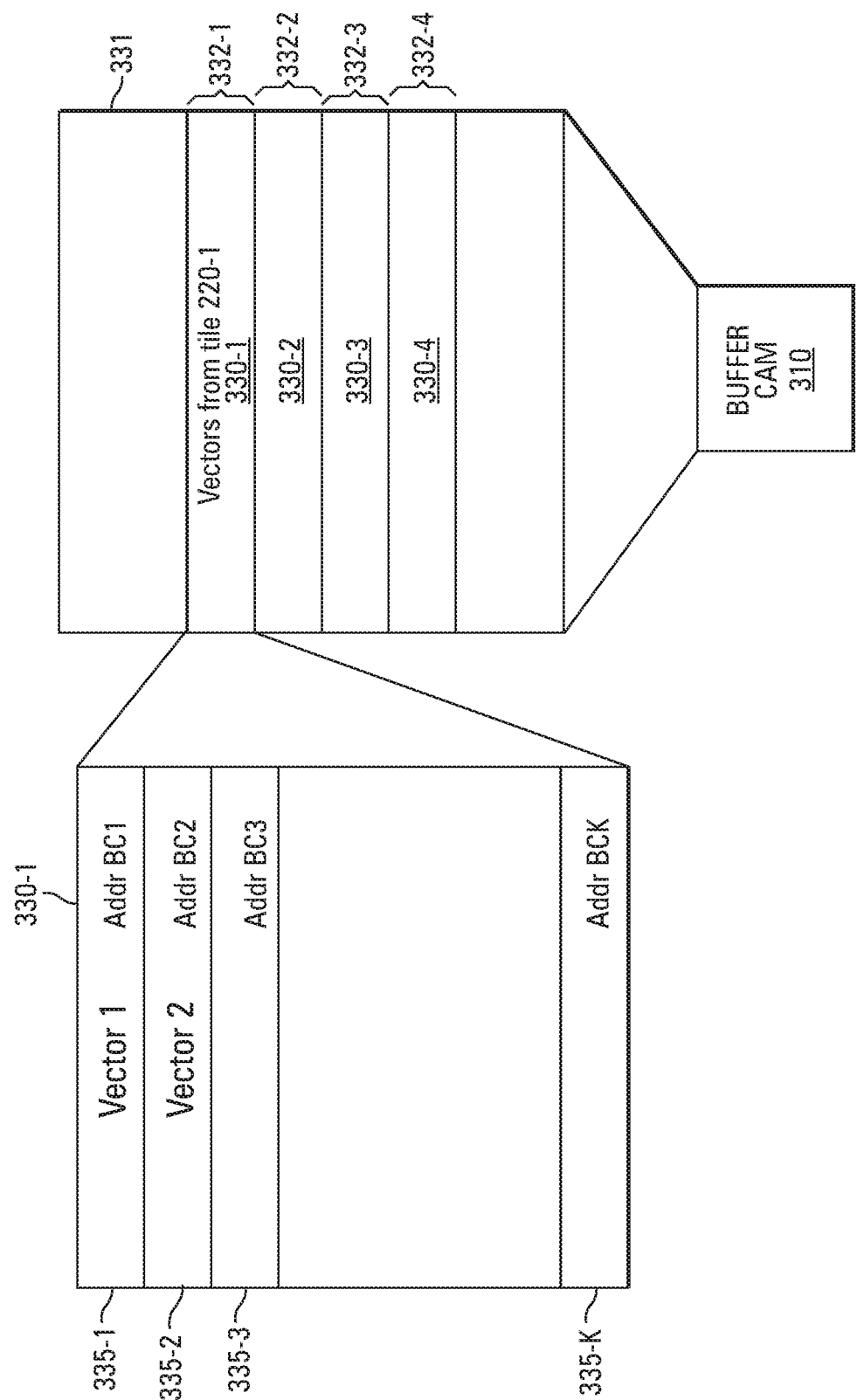
FIG. 3A is a block diagram of a portion of a buffer CAM corresponding to a particular stage of writing in accordance with a number of embodiments of the present disclosure.
Figure 3B:
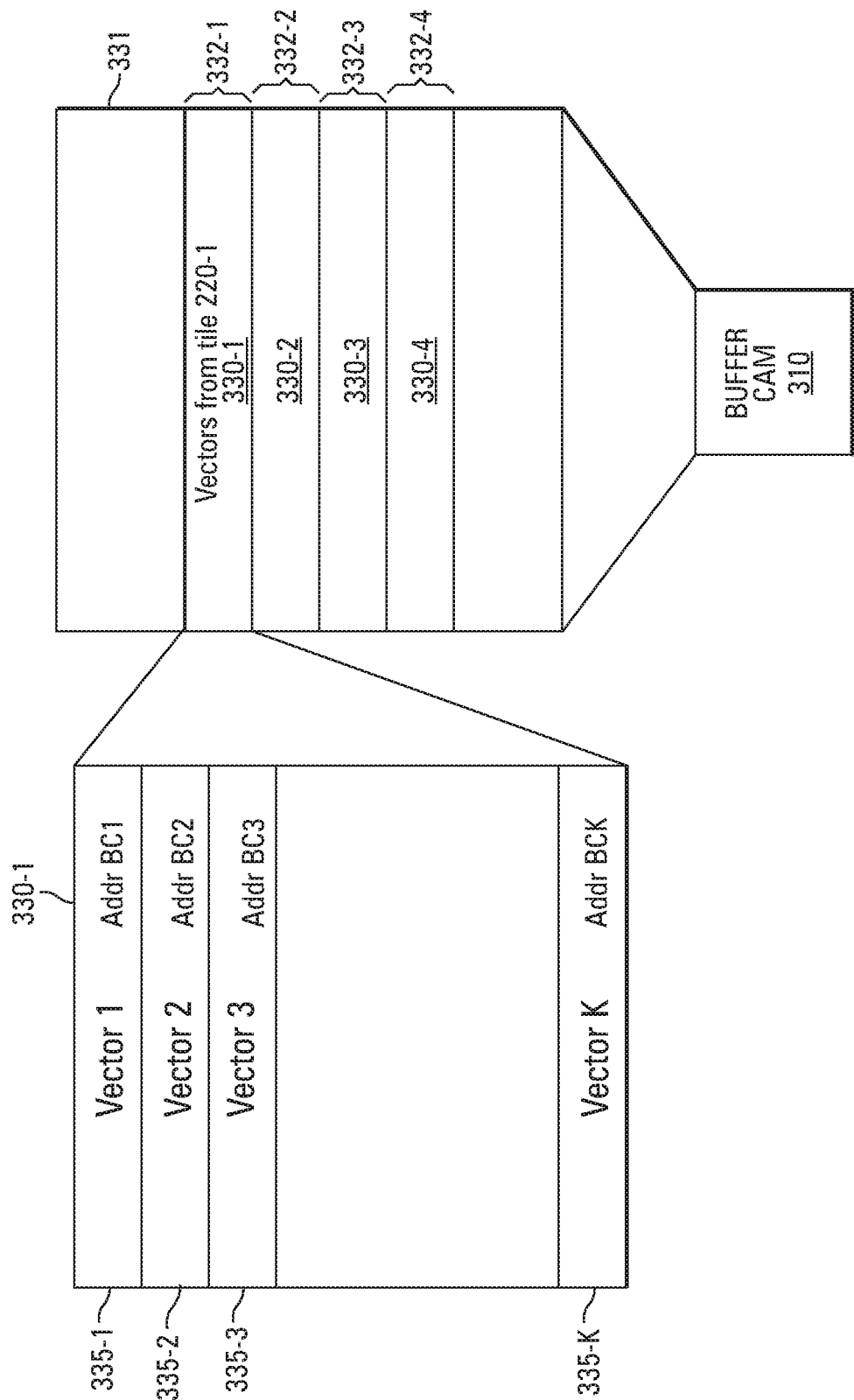
FIG. 3B is a block diagram of a portion of buffer CAM corresponding to a particular stage of writing subsequent to the particular stage of writing in FIG. 3A in accordance with a number of embodiments of the present disclosure.

FIG. 3A is a block diagram of a portion of a buffer CAM 310 corresponding to a particular stage of writing in accordance with a number of embodiments of the present disclosure. FIG. 3B is a block diagram of a portion of buffer CAM 310 corresponding to a particular stage of writing subsequent to the particular stage of writing in FIG. 3A in accordance with a number of embodiments of the present disclosure. For example, buffer CAM 310 can be a CAM 110. In some examples, the particular stage of writing in FIG. 3A can correspond to the particular stage of writing in FIG. 2A, and the particular stage of writing in FIG. 3B can correspond to the particular stage of writing in FIG. 2B.

Buffer CAM 310 can have a CAM array 331 of volatile memory cells, such as SRAM memory cells, that can store vectors from various memory tiles from various main CAMs, such as CAMs 106-1 to 106-8 and/or CAM 206. The vectors from the respective memory tiles can be stored in respective regions 330-1 to 330-4. For example, the regions can store data vectors from memory tiles that are currently being written and/or that are partially filled. Although four regions are shown in the examples of FIGS. 3A and 3B, there can be any number of regions, for example, depending on the number memory tiles whose data vectors might need to be stored in buffer CAM 310.

Regions 330-1 to 330-4 can respectively correspond to address ranges 332-1 to 332-4 in buffer CAM 310. The addresses of the respective memory tiles can be respectively mapped to the address ranges 332-1 to 332-4. Note, for example, that the vectors from memory tile 220-1 in FIGS. 2A and 2B can be stored in region 330-1 and that an address of memory tile 220-1 can be mapped to the address range 332-1.

The respective data vectors from a respective memory tile can be stored in respective locations in a respective region corresponding to the respective memory tile. For example, each respective location can include a respective group of volatile memory cells that can store a respective data vector. The respective locations in each respective region can have the addresses in the address range 332 corresponding to the respective region. The locations in each respective region can correspond to the locations in the respective memory tile.

For example, the locations 335-1 to 335-K in region 330-1 can respectively correspond to the locations 225-1 to 225-K in memory tile 220-1 and can respectively have the addresses Addr BC1 to Addr BCK of the address range 332-1. In some examples, the addresses Addr 1 to Addr K of memory tile 220-1 can be respectively mapped to the addresses Addr BC1 to Addr BCK of region 330-1.

Note that the Vector 1 and Vector 2 can be written in tile 220-1 and region 330-1 concurrently until Vector 1 and Vector 2 are finished being written in region 330-1. Vector 1 and Vector 2 in region 330-1 can be queried while continuing to write Vector 1 and Vector 2 in memory tile 220-1 and/or as long as memory tile 220-1 is partially filled with data vectors, as shown in FIG. 2A.

In some examples, Vector 1 and Vector 2 can be copied into region 330-1 in response to write enabling memory tile 220-1 to write Vector 3 to Vector K in memory tile 220-1, as discussed previously in conjunction with FIG. 2B. After copying Vector 1 and Vector 2 into region 330-1, Vector 3 to Vector K can be written concurrently in memory tile 220-1 and region 330-1, as shown in FIGS. 2B and 3B, until Vector 3 to Vector K are finished being written in region 330-1.

For example, Vector 3 to Vector K can be respectively written in locations 225-3 to 225-K and locations 335-3 to 335-K concurrently until writing Vector 3 to Vector K in locations 335-3 to 335-K is completed. Vector 3 to Vector K in region 330-1 can be queried while continuing to write Vector 3 to Vector K in tile 220-1 and/or until Vector 3 to Vector K are finished being written in memory tile 220-1 such that memory tile 220-1 is completely filled with data vectors, as shown in FIG. 2B. Controller 104 can invalidate the mapping between the address of tile 220-1 and address range 332-1 and/or can cause buffer CAM 310 to remove Vector 3 to Vector K from region 330-1 in response to memory tile 220-1 being completely filled with data vectors.

Figure 4:
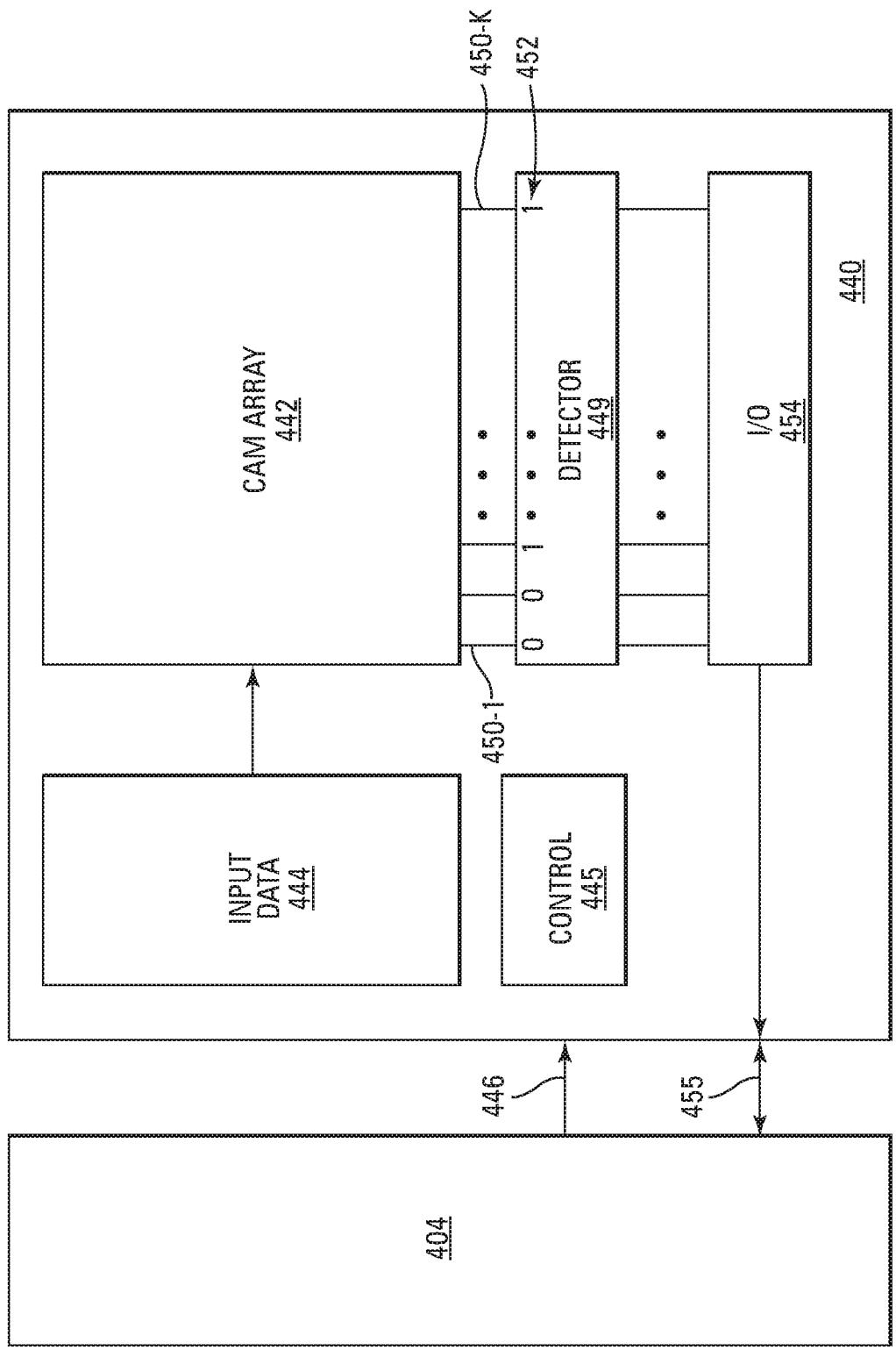
FIG. 4 is a simplified block diagram of a CAM in accordance with a number of embodiments of the present disclosure.

FIG. 4 is a simplified block diagram of a CAM 440 in accordance with a number of embodiments of the present disclosure. For example, CAM 440 can be configured as a main CAM or a buffer CAM. CAM 440 includes a CAM array 442 that can be coupled to input data register 444. For example, CAM array 442 can be CAM array 218 for examples in which CAM 440 is a main CAM or a CAM array 331 for examples in which CAM 440 is a buffer CAM. CAM array 442 can store data (e.g., in the form of stored data vectors), and input data register 444 can receive an input data vector from a controller 404 (e.g., that can be controller 104) to be compared to the stored data vectors. For example, the stored data vectors can be queried by the input data vector. In examples in which CAM 440 is a buffer CAM, CAM array 222 can be an SRAM memory array having SRAM cells. In examples in which CAM 440 is a main CAM, CAM array 442 can be a non-volatile memory array having non-volatile memory cells, such as resistance variable memory cells (e.g., arranged in a cross-point fashion).

CAM 440 can have control circuitry 445 (e.g., a control state machine) that can direct the internal operation of CAM 440 and can manage CAM array 442. Control circuitry 445 can receive control signals from controller 404 over a control interface 446. For example, controller 404 can cause control circuitry 445 to query the data vectors stored in CAM array 442 with an input data vector by causing control circuitry 445 to compare the input data vector to the data vectors stored in CAM array 442. Controller 404 can also cause control circuitry 445 to write the data vectors in CAM array 442. In some examples, controller 445 can include the match validation circuitry described previously in conjunction with FIG. 1A.

A detector 449 can be coupled to CAM array 442 by lines 450-1 to 450-K (e.g., match lines). For example, each of the respective lines 450-1 to 450-K can correspond to a respective data vector stored in CAM array 442. For example, the respective lines 450-1 to 450-K can respectively correspond to the respective data vectors of a tile, such as Vector 1 to Vector K of tile 220-1, in examples in which CAM 440 is a main CAM. In examples in which CAM 440 is a buffer CAM, the respective lines 450-1 to 450-K can respectively correspond to the respective data vectors in a region in the buffer CAM, such as Vector 1 to Vector K in region 330-1.

Detector 449 can detect whether the stored data vectors match the input data vector and can generate a respective result (e.g., a data bit) for each respective stored data vector indicative of whether the respective stored data vector matches the input data vector.

For example, as shown in FIG. 4, detector 449 might generate a data bit having a value of logical one (1) to indicate that a respective stored data vector matched the input data vector and a data bit having a value of logical zero (0) to indicate that a respective stored data vector did not match (e.g., mismatched) the input data vector. However, the disclosure is not so limited, and the roles of logical 1 and logical 0 can be reversed. In some examples, the results of the vector comparisons can be combined to form a result (e.g., an output) vector 452 having a component (e.g., a 1 or a 0) corresponding to each stored vector.

Detector 449 can be configured to associate (e.g., link) the address of each respective stored vector to a respective result in (e.g., a respective component of) result vector 452. In some examples, detector 449 can have sense amplifier (e.g., not shown in FIG. 4) coupled to each of lines 450-1 to 450-K. For example, each sense amplifier can be configured to generate a logical 1 or 0, depending on whether the sense amplifier detects a match or a mismatch. Result vector 452 and the associated addresses of the components can be sent to an input/output (I/O) buffer 454 for output to controller 404 over an interface 455.

In examples in which CAM 440 is a buffer CAM, the result vector 452 can be output to controller 404 in response to the buffer CAM being queried in place of a main CAM. Note that the addresses associated with the components of result vector 452 can be mapped to the addresses of the data vectors in the main CAM. In some examples, controller 404 can associate respective logical addresses with the addresses of the data vectors in the main CAM and can output the result vector to a host, such as host 103.

Figure 5:
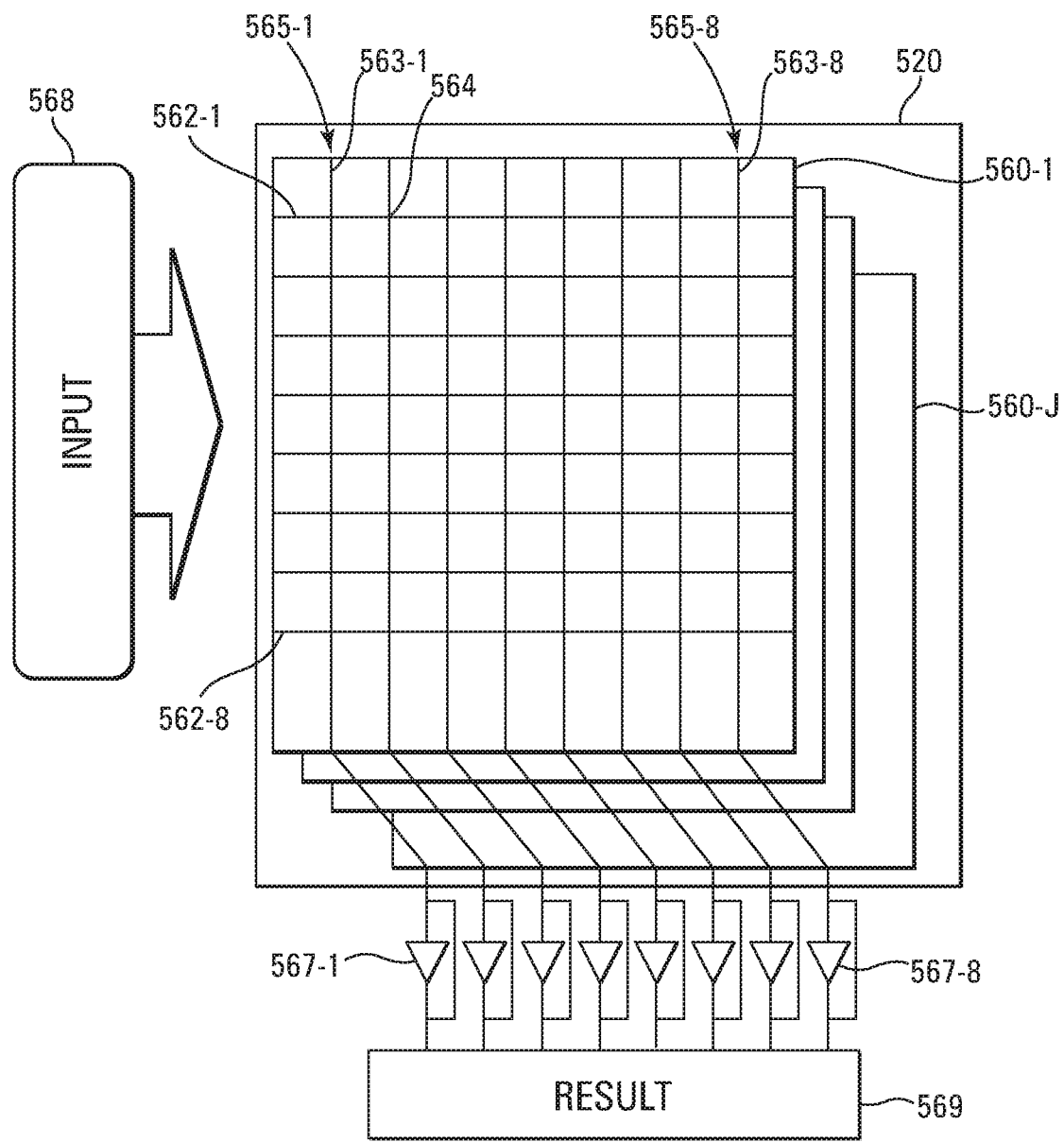
FIG. 5 illustrates a portion of a non-volatile CAM in accordance with a number of embodiments of the present disclosure.

FIG. 5 illustrates a portion of a non-volatile CAM in accordance with a number of embodiments of the present disclosure. For example, FIG. 5 illustrates a portion, such as a memory tile 520 that can be a tile 220, of a non-volatile CAM array of a main CAM. Memory tile 520 can have a quantity of data planes, such as data vector planes 560-1 to 560-J.

Each data vector plane 560 can have word lines 562-1 to 562-8. Each of the word lines 562-1 to 562-8 can cross bit lines 563-1 to 563-8. As such, each data vector plane 560 can be a cross point data vector plane. There can be a memory cell 564, such as a resistance variable memory cell, at each crossing of a word line and a bit line. In some examples, a group of memory cells (e.g., a column of memory cells) commonly coupled to a bit line 563 can store a data vector. For example, the columns of memory cells respectively commonly coupled to bit lines 563-1 to 563-8 can respectively store data vectors 565-1 to 565-8. Although, eight bit lines and eight word lines are shown, there can be any number of bit lines and word lines.

The bit lines 563-1 to 563-8 in each vector plane 560 can be respectively coupled to sense amplifiers 567-1 to 567-8. Sense amplifiers 567-1 to 567-8 can respectively generate results of comparisons of an input data vector 568 to stored vectors 565-1 to 565-8. For example, the results can be components of a result vector 569. In some examples, the stored data vectors in a tile can be compared to input data vector 466 a plane at a time (e.g., on a plane by plane basis).

Figure 6:
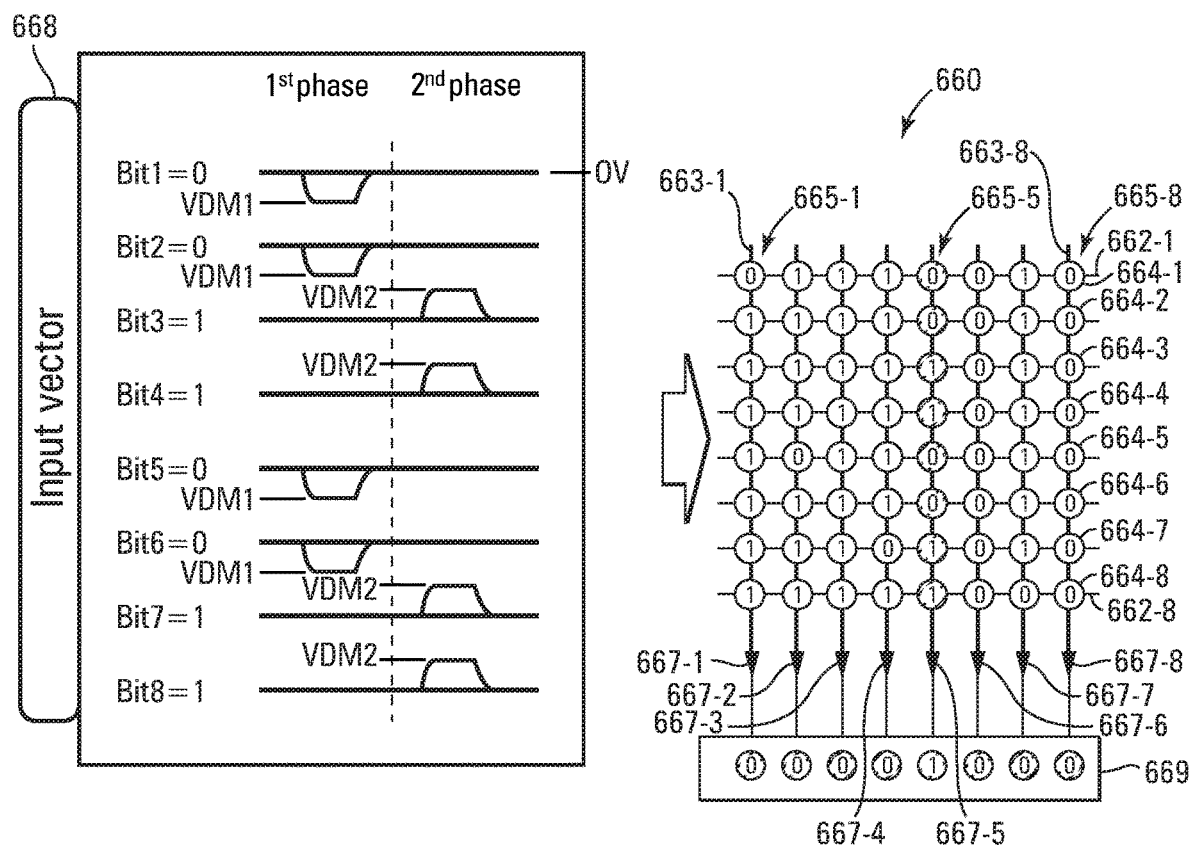
FIG. 6 illustrates querying data stored in a non-volatile CAM in accordance with a number of embodiments of the present disclosure.

FIG. 6 illustrates querying data stored in a non-volatile main CAM in accordance with a number of embodiments of the present disclosure. For example, the stored data is being queried by input data by comparing the input data to the stored data. For example, in FIG. 6, an input data vector 668 is being compared to data vectors 665-1 to 665-8 in a vector plane 660 (e.g., that can be a memory tile) of a main CAM concurrently. Input data vector 668 can have, for example, component data (e.g., bit) values 00110011 respectively corresponding to bits Bit1 to Bit8.

Vector plane 660 can have word lines 662-1 to 662-8. Each of the word lines 662-1 to 662-8 can cross bit lines 663-1 to 663-8. There can be a memory cell 664, such as a resistance variable memory cell, at each crossing of a word line and a bit line. Although eight bit lines and eight word lines are shown in the example of FIG. 6, embodiments are not limited to a particular number of word lines and/or bit lines.

Data vectors 665-1 to 665-8 can be respectively stored in columns of memory cells respectively commonly coupled to bit lines 663-1 to 663-8. For example, memory cells 664-1 to 664-8 in each respective column can be respectively coupled to word lines 662-1 to 662-8. In this example, data vector 665-1 (01111111) is stored in cells coupled to bit line 663-1, data vector 665-2 (11110111) is stored in cells coupled to bit line 663-2, data vector 665-3 (11111111) is stored in cells coupled to bit line 663-3, data vector 665-4 (11111101) is stored in cells coupled to bit line 663-4, data vector 665-5 (00110011) is stored in cells coupled to bit line 663-5, data vector 665-6 (00000000) is stored in cells coupled to bit line 663-6, data vector 665-7 (11111110) is stored in cells coupled to bit line 663-7, and data vector 665-8 (00000000) is stored in cells coupled to bit line 665-8. Note that the respective data values (e.g., components) of each of respective data vectors 665-1 to 665-8 are respectively stored in memory cells 664-1 to 664-8

The bit lines 663-1 to 663-8 can be respectively coupled to sense amplifiers 667-1 to 667-8. Sense amplifiers 667-1 to 667-8 can respectively generate results of comparisons of input data vector 668 to stored vectors 665-1 to 665-8. For example, the results can be components of a result vector 669 (00001000).

Bit1 to Bit8 of input data vector 668 can be respectively compared to the data respectively stored in the memory cells 664-1 to 664-8 coupled to each of data lines 663-1 to 663-8. A bit value of logical 0 can be compared to the data stored in a memory cell 664 by applying a voltage differential, such as a demarcation voltage VDM1, across the memory cell. A bit value of logical 1 can be compared to the data stored in a memory cell 664 by applying a demarcation voltage VDM2 across the memory cell.

For example, VDM1 can correspond to an input bit value of logical 0, and VDM2 can correspond to an input bit value of logical 1. In some examples, a demarcation voltage can be a voltage applied to a bit line coupled to the memory cell minus a voltage applied to a word line coupled to the memory cell. Note that in the present example, VDM1 and VDM2 have opposite polarities, with VDM1 having a negative polarity and VDM2 having a positive polarity. However, the present disclosure is not so limited.

In some examples, a memory cell 664 may experience a switching event, such as a thresholding event, (e.g., a snapback event) in response to applying VDM1 across the memory cell 664 or a switching event in response to applying VDM2 across the memory cell 664. For example, the memory cell 664 can switch from one conductivity state, such as a low conductivity state (e.g., high resistive state), to another conductivity state, such as a high conductivity state (e.g., a low resistive state).

In some examples, a memory cell experiencing a switching event in response to a demarcation voltage may be deemed as storing a data value that mismatches the input data value corresponding to the demarcation voltage. For example, a memory cell storing a logical 1 may experience a switching event in response applying VDM1 (e.g., corresponding to an input logical 0) across that memory cell, and a memory cell storing a logical 0 may experience a switching event in response applying VDM2 (e.g., corresponding to an input logical 1) across that memory cell.

In such an example, a memory cell not experiencing switching event in response to the demarcation voltage may be deemed as storing a data value that matches the input data value corresponding to the demarcation voltage. For example, a memory cell storing a logical 0 might not experience a switching event in response applying VDM1 across that memory cell, and a memory cell storing a logical 1 might not experience a switching event in response applying VDM2 across that memory cell. Note, however, that in other examples, a switching event can be indicative of a match and no switching event can be indicative of a mismatch.

Note that if the data stored in least one of the memory cells of a data vector 665 mismatches the corresponding bit of the input data vector 668, then the data vector 665 can be deemed to mismatch input data vector 668. A sense amplifier 667 may sense a switching event experienced by one or more memory cells in a corresponding data vector 665 by sensing a change in current that may be reflected in the output voltage of the sense amplifier. As a result, the sense amplifier can sense a mismatch between the data vector coupled to the sense amplifier and input data vector 668 by sensing a switching event. For example, the sense amplifier might generate (e.g., output) a logical 0, in response to sensing a switching event, to indicate a mismatch between the data vector coupled to the sense amplifier and input data vector 668. The sense amplifier might generate a logical 1, in response to not sensing a switching event, to indicate a match between the data vector coupled to the sense amplifier and input data vector 668.

In some examples, a portion of the input data vector 668 can be compared to corresponding portions of the data vectors 665-1 to 665-8 during a first time period corresponding to a first phase of the comparison, and a remaining portion of the input data vector 668 can be compared to corresponding portions of the data vectors 665-1 to 665-8 during a second time period corresponding to a second phase of the comparison. During the first phase, Bit1, Bit2, Bit5, and Bit6 of input data vector 668 having logical 0s can be respectively compared to the data values stored in the memory cells 664-1, 664-2, 664-5, and 664-6 of each of data vectors 665-1 to 665-8 by applying VDM1 across those memory cells while zero volts, for example, is applied across remaining memory cells 664-3, 664-4, 664-7, and 664-8.

During the second phase, Bit3, Bit4, Bit7, and Bit8 of input data vector 668 having logical is can be respectively compared to the data values stored in the memory cells 664-3, 664-4, 664-7, and 664-8 of each of data vectors 665-1 to 665-8 by applying VDM2 across those memory cells while zero volts, for example, is applied across remaining memory cells 664-1, 664-2, 664-5 and 664-6. However, the present disclosure is not so limited, and VDM1 and VBM2 can be applied concurrently (e.g., during the same phase).

In some examples, VDM1 can be replaced with a write voltage to write (e.g., program) the memory cells to a resistance state corresponding to a logical 0. For example, the write voltage can be greater, in a negative sense, than VDM1. In some examples, VDM2 can be replaced with a write voltage to write the memory cells to a resistance state corresponding to a logical 1. For example, the write voltage can be greater, in a positive sense, than VDM2. In some examples, the write voltage to write a logical 0 can be applied during the first phase and the write voltage to write a logical 1 can be applied during the second phase. However, the present disclosure is not so limited, and the respective write voltages can be applied concurrently (e.g., during the same phase).

The CAM arrays of the main CAMs can include two-dimensional (2D) and/or three-dimensional (3D) array structures, such as cross point array structures. The memory cells (e.g., memory cells 564 and 664) can include, for example, various types of resistance variable storage elements and/or switch elements. For example, the cells can be phase change random access memory (PCRAM) cells or resistive random access memory (RRAM) cells.

As used herein, a storage element refers to a programmable portion of a memory cell. For instance, the main CAMs can be 3D cross point devices whose cells can include a "stack" structure in which a storage element is coupled in series with a switch element and which can be referred to herein as a 3D phase change material and switch (PCMS) device. 3D PCMS cells can include, for example, a two-terminal chalcogenide-based storage element coupled in series with a two-terminal chalcogenide-based switch element, such as an ovonic threshold switch (OTS). In some examples, the memory cells can be self-selecting memory (SSM) cells in which a single material can serve as both the switch element and the storage element. An SSM cell can include a chalcogenide alloy; however, embodiments are not so limited.

As non-limiting examples, the memory cells of the disclosed non-volatile CAMs can include a phase change material (e.g., phase change chalcogenide alloy) such as an indium (In)-antimony (Sb)-tellurium (Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other memory cell materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

In the preceding detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" or a "quantity of" something can refer to one or more of such things. For example, a number of or a quantity of memory cells can refer to one or more memory cells. A "plurality" of something intends two or more. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). As used herein, multiple acts being performed concurrently refers to acts overlapping, at least in part, over a particular time period.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a controller;
   a first content addressable memory coupled to the controller; and
   a second content addressable memory coupled to the controller;
   wherein the controller is configured to:
      cause the first content addressable memory to write data in the first content addressable memory;
      cause the second content addressable memory to write the data in the second content addressable memory wherein the first and second content addressable memories write the data in the first and second content addressable memories concurrently until the second content addressable memory is finished writing the data in the second content addressable memory; and cause the second content addressable memory to query the data written in the second content addressable memory while the first content addressable memory continues to write the data in the first content addressable memory.

2. The apparatus of claim 1, wherein the controller is configured to:

cause the first content addressable memory to write the data in a memory tile of the first content addressable memory;

cause the second content addressable memory to write the data in a region in the second content addressable memory; and map a location of the memory tile in the first content addressable memory to a location of the region in the second content addressable memory.

3. The apparatus of claim 2, wherein the controller is configured to invalidate the map of the location of the memory tile to the location of the region in response to determining that the memory tile is full of data.

4. The apparatus of claim 2, wherein the controller is configured to cause the second content addressable memory to remove the data from the region in response to determining that the memory tile is full of data.

5. The apparatus of claim 1, wherein the second content addressable memory is configured query the data written in the second content addressable memory by comparing input data to the data written in the second content addressable memory.

6. The apparatus of claim 1, wherein the second content addressable memory is a volatile content addressable memory and the first content addressable memory is a non-volatile content addressable memory.

7. The apparatus of claim 1, wherein the first content addressable memory is configured to write the data in resistance-variable memory cells in the first content addressable memory; and the second content addressable memory is configured to write the data in static random access memory cells in the second content addressable memory.

8. The apparatus of claim 1, wherein the controller is configured to:

map a location of the data in the first content addressable memory to a location of the data in the second content addressable memory while the data is being written to the first content addressable memory; and invalidate the map in response to the first content addressable memory completing the write of the data in the first content addressable memory.

9. The apparatus of claim 8, wherein the controller is configured to map a logical address received from a host to a physical address of the location of the data in the first content addressable memory.

10. The apparatus of claim 1, wherein the controller is configured to cause the second content addressable memory to remove the data from the second content addressable memory in response to the first content addressable memory completing the write of the data in the first content addressable memory.

11. An apparatus, comprising:

a controller;

a main content addressable memory coupled to the controller; and a buffer content addressable memory coupled to the controller;

wherein the controller is configured to:

cause the buffer content addressable memory to query the buffer content addressable memory in place of the main content addressable memory querying a partially filled memory tile in the main content addressable memory; and cause the main content addressable memory to query memory tiles in the main content addressable memory that are completely filled with data concurrently with causing the buffer content addressable memory to query the buffer content addressable memory in place of the main content addressable memory querying a partially filled memory tile.

12. The apparatus of claim 11, wherein the controller is configured to cause all data vectors in the partially filled memory tile to be copied from the partially filled memory tile into the buffer content addressable memory in response to causing the main content addressable memory to write enable the partially filled memory tile.

13. The apparatus of claim 12, wherein the data vectors copied into the buffer content addressable memory from the partially filled memory tile are first data vectors; and the controller is configured to:

cause the main content addressable memory to write a second data vector in a free location in the partially filled memory tile in response to causing the main content addressable memory to write enable the partially filled memory tile;

cause the buffer content addressable memory to write the second data vector in the buffer content addressable memory while the main content addressable memory is writing the second data vector in the partially filled memory tile; and cause the buffer content addressable memory to query the first and second data vectors in the buffer content addressable memory while the main content addressable memory continues to write the second data vector in the partially filled memory tile.

14. The apparatus of claim 13, wherein the free location in the partially filled memory tile is sequential to sequential locations of the first data vectors in the partially filled memory tile.

15. The apparatus of claim 13, wherein the controller is configured to manage a data structure comprising an entry that maps an address of a location of the partially filled memory tile in the main content addressable memory to a range of addresses in the buffer content addressable memory corresponding to the first and second data vectors.

16. The apparatus of claim 11, wherein the main content addressable memory is configured to replace a first data vector in the main content addressable memory with a second data vector by:

writing the second vector in a free location the main content addressable memory; and mapping a location of the first data vector in the main content addressable memory to the free location.

17. The apparatus of claim 16, wherein the free location is in a same memory tile as the location of the first data vector.

18. The apparatus of claim 16, wherein the free location is in a different memory tile than the location of the first data vector.

19. A method, comprising:
writing a data vector in a memory tile of a first content addressable memory;
writing the data vector in a region of a second content addressable memory corresponding to the memory tile; and
querying the region in place of the memory tile in response to determining that the memory tile is not full of previously written data vectors.

20. The method of claim 19, wherein:
writing the data vector in the memory tile and in the region comprises writing the data vector in the memory tile and in the region concurrently until writing the data vector in the region is completed; and
querying the region in place of the memory tile comprises querying the data vector in the region while writing the data vector in the memory tile after writing the data vector in the region is completed.

21. The method of claim 19, further comprising:
querying an additional memory tile in the first content addressable memory, concurrently with querying the region in place of the memory tile in response to determining that the additional memory tile is full of previously written data vectors.

22. The method of claim 19, further comprising copying a previously written data vector in the memory tile into the region before writing the data vector in the memory tile and in the region.

23. The method of claim 19, wherein writing the data vector in the memory tile comprises writing the data vector sequentially after a last written data vector in the memory tile.

24. The method of claim 19, wherein writing the data vector in the memory tile comprises writing the data vector in a first available memory tile following sequence of unavailable memory tiles.

25. The method of claim 19, further comprising:
comparing an input data vector to an additional data vector stored in the first content addressable memory or the second content addressable memory; and
determining, by match validation circuitry, whether a match between the input data vector and the additional data vector is valid.

26. An apparatus, comprising:
a controller;
a first content addressable memory coupled to the controller; and
a second content addressable memory coupled to the controller;
wherein the controller is configured to:
cause the first content addressable memory to write data in a memory tile of the first content addressable memory;
cause the second content addressable memory to write the data in a region of the second content addressable memory;
map a location of the memory tile in the first content addressable memory to a location of the region in the second content addressable memory;
invalidate the map of the location of the memory tile to the location of the region in response to determining that the memory tile is full of data; and
cause the second content addressable memory to query the data written in the second content addressable memory while the first content addressable memory continues to write the data in the first content addressable memory.

27. An apparatus, comprising:
a controller;
a first content addressable memory coupled to the controller; and
a second content addressable memory coupled to the controller;
wherein the controller is configured to:
cause the first content addressable memory to write data in a memory tile of the first content addressable memory;
cause the second content addressable memory to write the data in a region of the second content addressable memory;
map a location of the memory tile in the first content addressable memory to a location of the region in the second content addressable memory;
cause the second content addressable memory to remove the data from the region in response to determining that the memory tile is full of data; and
cause the second content addressable memory to query the data written in the second content addressable memory while the first content addressable memory continues to write the data in the first content addressable memory.

28. An apparatus, comprising:
a controller;
a main content addressable memory coupled to the controller; and
a buffer content addressable memory coupled to the controller;
wherein the controller is configured to cause the buffer content addressable memory to query the buffer content addressable memory in place of the main content addressable memory querying a partially filled memory tile in the main content addressable memory, and
wherein the controller is configured to cause all data vectors in the partially filled memory tile to be copied from the partially filled memory tile into the buffer content addressable memory in response to causing the main content addressable memory to write enable the partially filled memory tile.

29. An apparatus, comprising:
a controller;
a main content addressable memory coupled to the controller; and
a buffer content addressable memory coupled to the controller;
wherein the controller is configured to cause the buffer content addressable memory to query the buffer content addressable memory in place of the main content addressable memory querying a partially filled memory tile in the main content addressable memory, and
wherein the main content addressable memory is configured to replace a first data vector in the main content addressable memory with a second data vector by:
writing the second vector in a free location the main content addressable memory; and
mapping a location of the first data vector in the main content addressable memory to the free location.

30. A method, comprising:
writing a data vector in a memory tile of a first content addressable memory;
writing the data vector in a region of a second content addressable memory corresponding to the memory tile;

copying a previously written data vector in the memory tile into the region before writing the data vector in the memory tile and in the region; and querying the region in place of the memory tile.

* * * * *